(12) United States Patent
Ashby et al.

(10) Patent No.: US 7,091,415 B2
(45) Date of Patent: Aug. 15, 2006

(54) LOW PROFILE MASS INTERCONNECT DEVICE

(75) Inventors: Darryl M. Ashby, Weyers Cave, VA (US); Randall Garman, Grottoes, VA (US); Jeffrey P. Stowers, Mt. Sidney, VA (US); David L. Rocker, Charlottesville, VA (US)

(73) Assignee: Virginia Panel Corporation, Waynesboro, VA (US)

( * ) Notice: Subject to any disclaimer, the term of this patent is extended or adjusted under 35 U.S.C. 154(b) by 0 days.

(21) Appl. No.: 10/919,425

(22) Filed: Aug. 16, 2004

(65) Prior Publication Data
US 2006/0032652 A1 Feb. 16, 2006

(51) Int. Cl.
H02G 3/08 (2006.01)

(52) U.S. Cl. .......... 174/52.1; 174/50; 174/59; 174/61; 339/18 R; 339/18 B; 339/75 R; 339/75 M; 339/88; 339/90; 324/755; 324/761; 439/55; 439/68; 248/206.1; 248/222.1; 248/231.4

(58) Field of Classification Search .......... 174/52.1, 174/50, 59, 61; 339/18 R, 18 B, 75 R, 75 M, 339/88, 90; 324/755, 761; 439/55, 68; 248/206.1, 248/222.1, 231.4
See application file for complete search history.

(56) References Cited

U.S. PATENT DOCUMENTS

| 3,166,369 | A | * | 1/1965 | Trump .......................... 439/51 |
| 3,419,842 | A | * | 12/1968 | Taylor, Jr. ..................... 439/51 |
| 4,212,508 | A | | 7/1980 | Cline et al. |
| 4,213,666 | A | | 7/1980 | Braginetz et al. |
| 4,329,005 | A | | 5/1982 | Braginetz et al. |
| 5,037,321 | A | * | 8/1991 | Uratsuji et al. ............. 439/342 |
| 5,227,718 | A | | 7/1993 | Stowers et al. |
| 5,420,519 | A | | 5/1995 | Stowers et al. |
| 5,576,631 | A | | 11/1996 | Stowers et al. |
| 5,633,597 | A | | 5/1997 | Stowers et al. |
| 5,850,147 | A | | 12/1998 | Stowers et al. |
| 5,936,421 | A | | 8/1999 | Stowers et al. |
| 5,942,906 | A | | 8/1999 | Stowers et al. |
| 5,966,023 | A | | 10/1999 | Burgers et al. |

* cited by examiner

Primary Examiner—Dean A. Reichard
Assistant Examiner—Anton Harris
(74) Attorney, Agent, or Firm—24IP Law Group USA, PLLC; Timothy R. Dewitt

(57) ABSTRACT

A scalable mass interconnect device having a receiver assembly with module mounting members positioned in the receiver frame in a direction parallel to a plane of movement of the engagement cams in the receiver. Modules are mounted in the module mounting members such that the modules are perpendicular to a plane of movement of the engagement cams in the receiver.

13 Claims, 4 Drawing Sheets

LOW PROFILE MASS INTERCONNECT DEVICE

CROSS-REFERENCE TO RELATED APPLICATIONS

None.

STATEMENT REGARDING FEDERALLY SPONSORED RESEARCH OR DEVELOPMENT

Not applicable.

FIELD OF THE INVENTION

The invention relates broadly to an interface connection system and, more specifically, to a low profile mass interconnect device. Such connection interface equipment requires the frequent placement of interchangeable test adapters (ITA) or wiring modules with multiple minute electrical contacts in operative engagement with opposite co-acting electrical contacts of, for example, receiver modules. The receiver contacts and interchangeable test adapter/wiring contacts should engage with precision to minimize wear and to prevent damaging the delicate and expensive equipment.

BACKGROUND OF THE INVENTION

A variety of mass interconnect devices have been used in the past. One example of prior art interface systems was disclosed in U.S. Pat. No. 4,329,005, entitled "Slide Cam Mechanism for Positioning Test Adapter in Operative Relationship with a Receiver," which was assigned to Virginia Panel Corporation. In the '005 Patent, the receiver included an inner frame and outer walls. Between the outer walls and adjacent sides of the receiver frame were placed fixed hanger plates provided with straight slots and interior slides having coacting cam slots. The slides were driven by a hand lever and attached round torsion shaft with connected linkage having an over-dead-center locked position. Movement of the hand lever would cause the slides to move parallel to the outer walls and interior sides. Modules for holding various electrical contacts were mounted in the receiver parallel to the direction of movement of the slides.

The individual test adapter, or ITA, had four split roller dual bearings or rollers on common dry lube sleeves that would rotate oppositely during the camming action to minimize friction. The individual test adapter rollers rested on dwell shoulders of the cam slots and then descended through the straight slots during movement of the slides of the receiver to produce positive straight-on engagement of the test adapter and receiver multiple contacts. The slides had elongated linear guide bearings with dry lube pads for precision free movement. The slides were connected to a cylindrical torsion shaft via linkage. Like the receiver modules, the ITA modules were mounted in the system in a direction parallel to the ITA sides on which the rollers were located. When modules, pins, patchcords, and perhaps a cover are mounted to or on the interface test adapter, the assembly is sometimes referred to as a "fixture."

Another prior art system has been known as the MAC Panel Series 06, or rotating latch, interface device. In the rotating latch type device, the camming is performed by plates that rotate rather than moving in a linear fashion. In the rotating latch devices, the connector modules have been mounted to the receiver and test adapter frame parallel to the plant of rotation of the rotating latches.

Another prior art system sold by Virginia Panel Corporation included a receiver that included slides similar to those disclosed in the '005 patent but used pins at two corners, diagonal from one other, on the receiver. These pins inhibited vertical movement of the ITA in the receiver to produce straight-on engagement. This prior art system, shown in FIG. 6, included machined side rails 501 and a cylindrical torsion shaft.

Another prior interface device is known as the TTI Testron VG Series interface device. This device may be in a tabletop or a rack-mounted form. This VG Series device included a fixture support plate mounted to the receiver in a direction perpendicular to the face of the receiver. The receiver would be mounted directly to the test equipment.

The TTI Testron fixture, or test adapter, would be engaged to the receiver by lifting the fixture onto a pair of hooks protruding from the face of the receiver and then resting the fixture on the support plate. A handle and gears were used to pull the hooks, and hence, the fixture, into the receiver to cause the electrical contacts in the receiver and the fixture to mate.

Although these devices generally functioned well and provided advantages over prior devices, the devices did not provide users with convenient access to the connectors and wires of a test adapter after the test adapter had been assembled. Such access may be desirable to perform troubling shooting tasks and repairs on the test adapters. Further, the devices included many components, including some machined parts, which contributed to expense and increased time for manufacturing and assembling the products.

SUMMARY OF THE INVENTION

A receiver for a mass interconnect device in accordance with a preferred embodiment of the invention comprises a receiver frame having atop, a bottom, and two sides forming a face of the frame; one or more engagement cams positioned parallel to the two sides of the frame; and at least one module mounting member connected to the receiver frame parallel to the two sides of the receiver frame. The receiver may further comprise a platform, plate or table removably mounted to the receiver frame and supports connected to the underside of the platform.

The receiver may be mounted to test equipment by connecting the supports, or some other component of the receiver assembly, to retractable slides connected to the test equipment. Such an arrangement permits the user to slide the receiver away from the test equipment to access wiring behind the receiver.

Still other aspects, features, and advantages of the present invention are readily apparent from the following detailed description, simply by illustrating preferable embodiments and implementations. The present invention is also capable of other and different embodiments, and its several details can be modified in various respects, all without departing from the spirit and scope of the present invention. Accordingly, the drawings and descriptions are to be regarded as illustration in nature, and not as restrictive.

BRIEF DESCRIPTION OF THE DRAWINGS

The invention of the present application will now be described in more detail with reference to preferred embodiments of the architecture and method, given only by way of example, and with reference to the accompanying drawings, in which.

DESCRIPTION OF THE PREFERRED EMBODIMENTS

Figure 1:
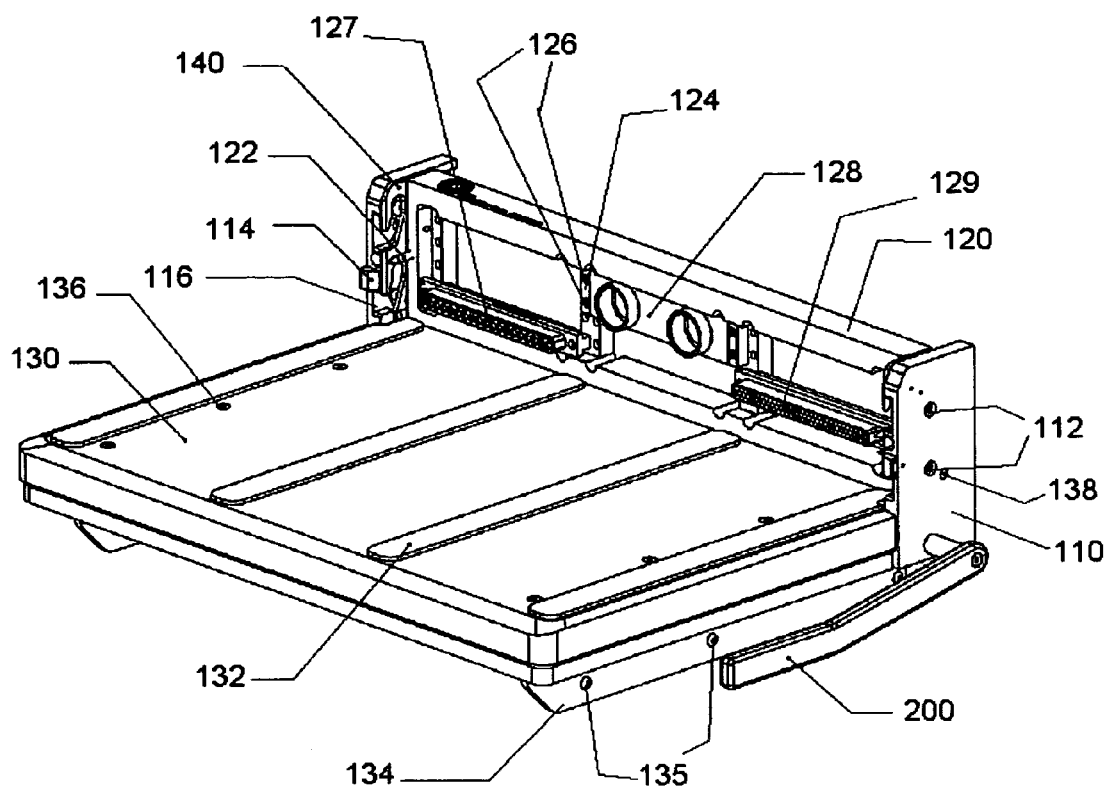
FIG. 1 is a perspective view of a receiver of a low profile mass interconnect device in accordance with an embodiment of the present invention.

A receiver assembly of an embodiment of the present invention will be described with reference to FIGS. 1–4. FIG. 1 illustrates a receiver assembly in accordance with an embodiment of the invention. A receiver frame 120 has fixture alignment pins 122 on one or both sides of the receiving for aligning a fixture for engagement with the receiver assembly. One or more mounting members 124 extend across a face of the receiver 120, adjacent the sides of the receiver frame, displaced from the sides of the receiver frame, or both. Each mounting member 124 has one or more module mounting holes 126 therein.

One or more modules 128, 129 of similar or varying types and sizes are mounted on the receiver frame 120 by connecting the modules to one or more mounting members 124. In this arrangement, the modules are mounted perpendicular to the direction of movement of the linearly moving engagement slides, or perpendicular to the plane of rotation or movement in a rotating latch or other cam embodiment. By arranging the modules in this manner, a lower profile interface device may be achieved. The modules may accommodate any type of contact, including, but not limited to, signal, power, coaxial, high frequency, pneumatic and fiberoptic.

In a preferred embodiment, each module 128, 129 is mounted to the receiver frame 120 by connecting the module to two mounting members 124 in the receiver frame 120. The modules may be connected to the module mounting members 124 via any of a variety of known methods such as with screws or spring means.

Figure 2:
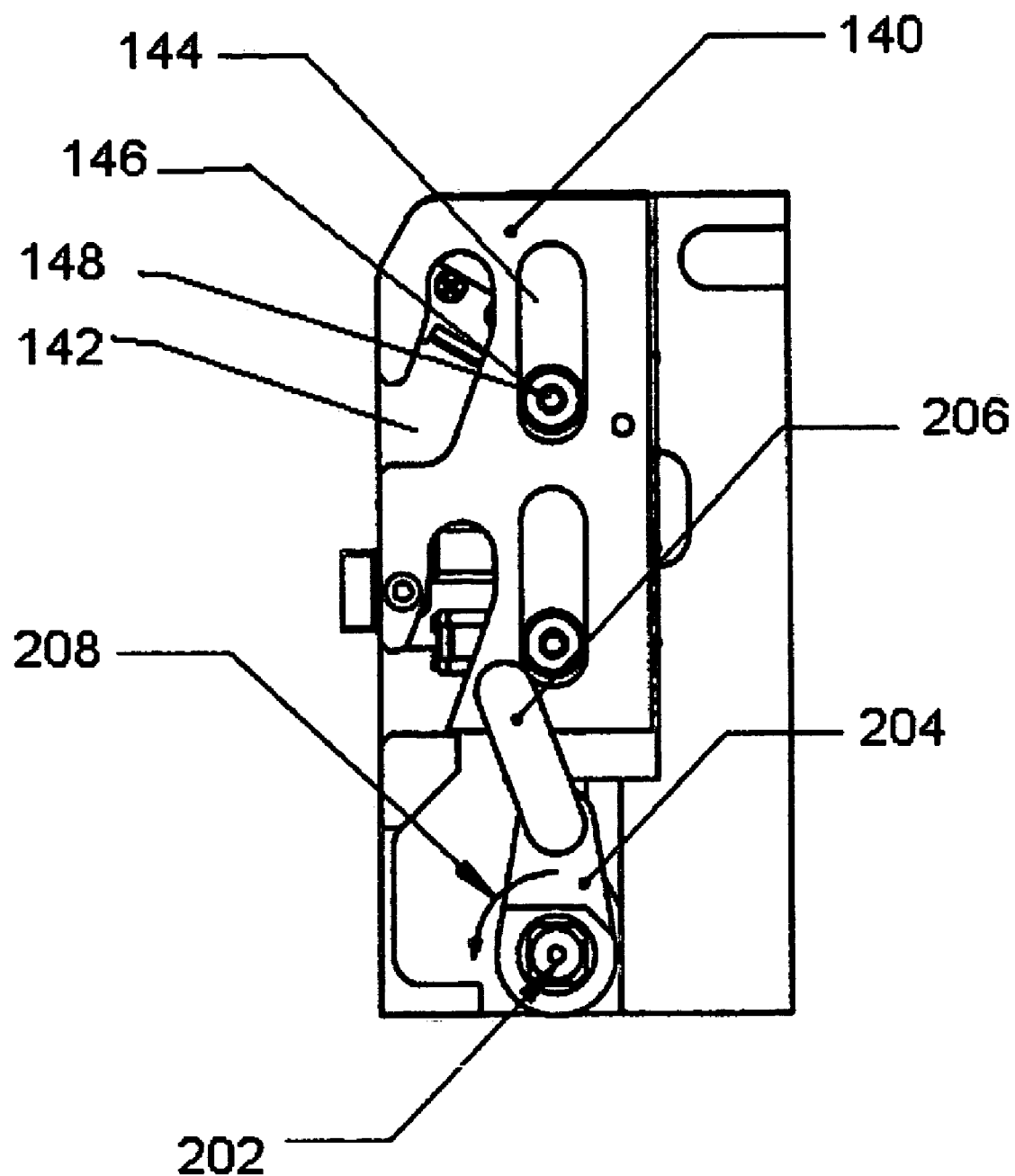
FIG. 2 is a side view of a receiver of a low profile mass interconnect device in accordance with an embodiment of the present invention.

At each side of the receiver assembly, there is an engagement slide 140 and a receiver out side wall 110. As shown in FIG. 2, each engagement slide 140 in this embodiment has a cam slot 142 and an elongated guide slot 144 therein. Each sidewall 110 has a pair of pins 146, each having a bearing 148 thereon for guiding the engagement slide in a linear motion. Each receiver outer sidewall 100 further may have slots or recesses 116 therein. Such recesses may accommodate pins extending from the sides of test adapters and may or may not be designed to guide the test adapters into the receiver. The cam slots in the engagement slides are use to exert force on pins, or pins having bearing thereon, on the sides of test adapters to draw the test adapters into the receiver. The camming action likewise could be performed by a plate that rotates around a single pin rather than moving linearly.

In the preferred embodiment, the engagement slides are driven by linkage 204, 206 connected to the torsion shaft 202. The torsion shaft 202 is connected to a handle 200. When the handle 200 is move to rotate the torsion shaft in the direction 208, the linkage drives the engagement slide 140 linearly to cam the test adapter pins in the cam slots 142 into the face of the receiver frame 120 thereby cause the pins in the test adapter to mate with pins in the receiver. When the handle 200 is moved in the opposite direction, the engagement slides is move linearly to cam to the test adapter pins away from or out of the face of the receiver frame thereby disengaging the respective pins in the test adapter and receiver. Although linkage 204, 206 is preferred, a similar motion may be achieved using a gear system or screw mechanism.

A test adapter (not shown) engaged with a receiver is held in place via over-dead-center locking of the linkage 204, 206. A spring mechanism or assembly 136 connected to the receiver sidewall 110 or the receiver frame 120 likewise may be used or may be used in conjunction with over-dead-center locking to secure the handle 200, and hence the test adapter, in an engaged position.

In a preferred embodiment, each receiver sidewall 110 has one or more fixture pre-alignment guides 114 protruding there from. The receiver sidewalls 110 may be mounted to the receiver frame via any of a variety of methods, although one or more screws 112 are used for this purpose in a preferred embodiment.

Figure 3:
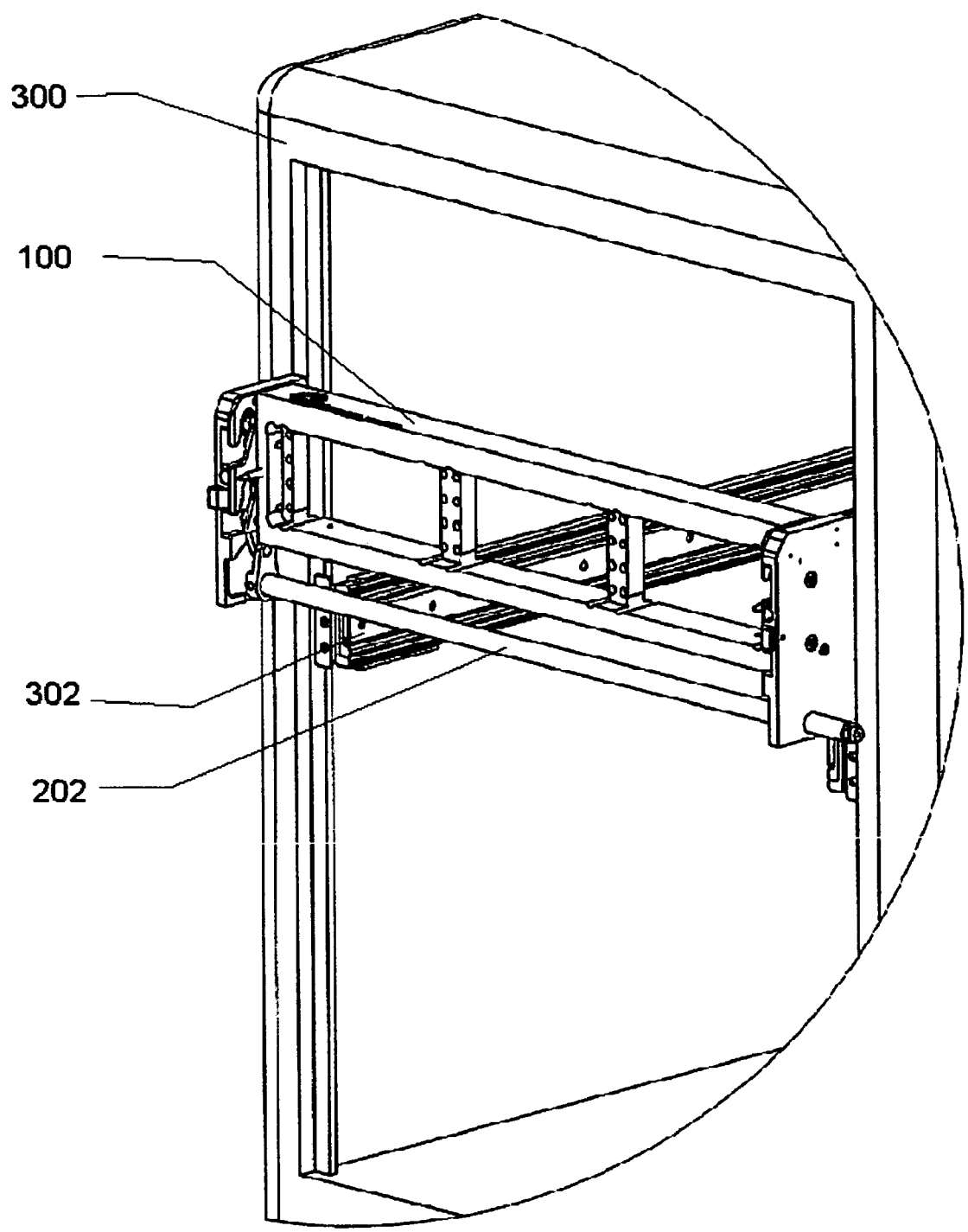
FIG. 3 is a perspective view of a receiver of an embodiment of the present invention with the table removed and the receiver mounted to a test rack.
Figure 4:
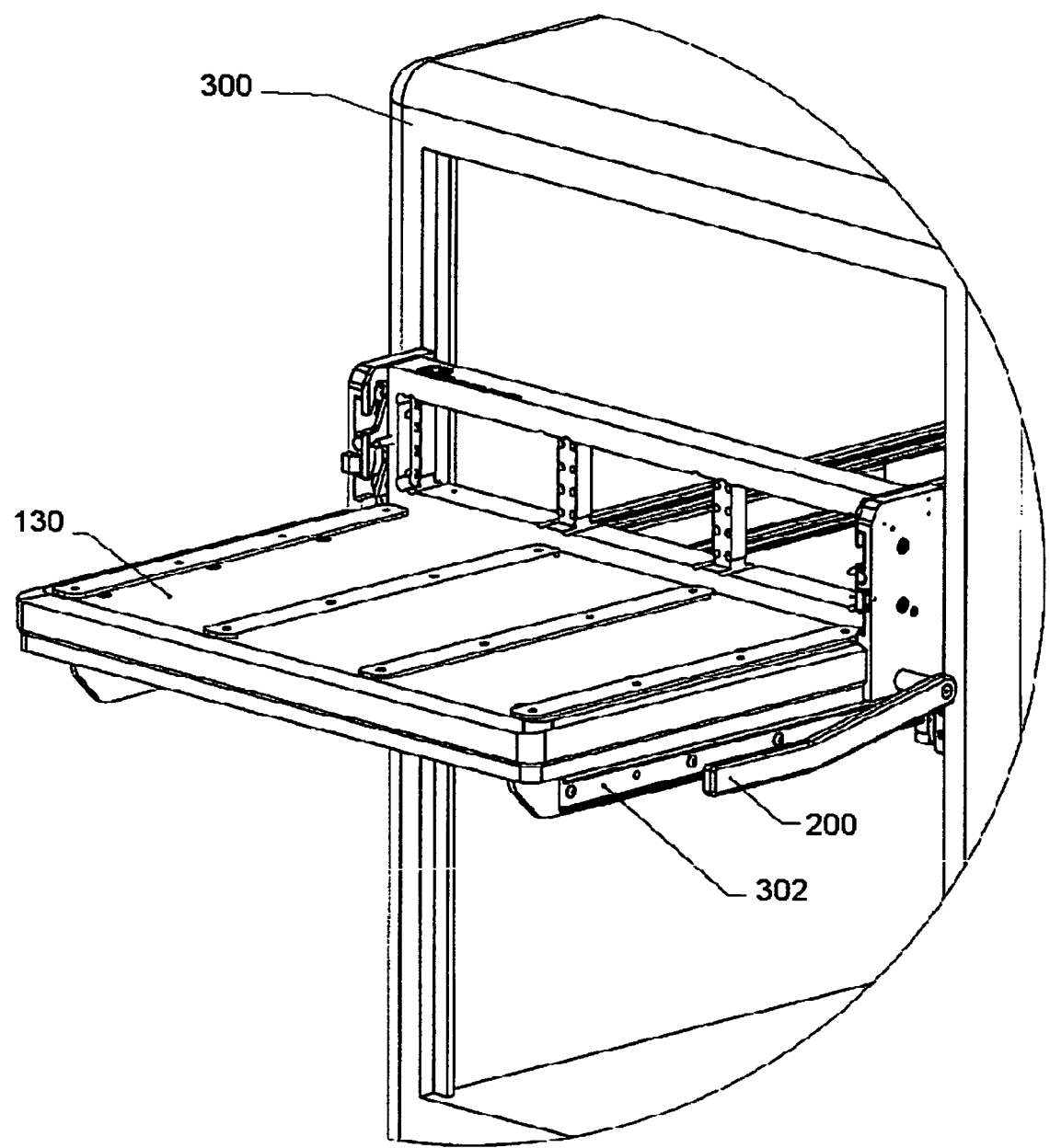
FIG. 4 is a perspective view of a receiver of an embodiment of the present invention mounted to a test rack on retractable slides.

In a preferred embodiment, a fixture support plate 130 and handle 200 are removably mounted to the receiver frame 120 and/or receiver outer sidewalls 110. By removing the support table and/or the handle, more convenient shipping and handling may be achieved. The fixture support plate may have one or more anti-friction sliding surfaces 132 thereon. FIG. 3 illustrates a receiver with the support table 130 removed. In FIG. 3, the receiver is mounted directly to a rack The receiver assembly further has a pair of supports or legs 134 mounted to the fixture support plate 130 via one or more screws 136. As shown in FIG. 4, the receiver may be mounted onto test equipment via retractable slides 302 rather than being mounted directly to a rack or test equipment. In FIG. 4, the receiver is connected to the support table, and the table legs 134 are mounted to the retractable slides 302. The retractable slides 302 permit the user to slide the receiver out from the test equipment after the receiver is mounted to access the wiring behind the receiver. The use of retractable slides or other means for permitting the receiver to be displaced from the test equipment allows users of the equipment to check and/or repair the wiring and pins quickly and easily.

In operation, a user will place a fixture onto the support table 130 and slide the fixture along the anti-friction surfaces 132 toward the receiver to place the pins on the sides of the test adapter into openings in the slide plates on either side of the receiver. After pushing the fixture into that position, the user may close the handle to engage the pins in the fixture with the pins in the receiver.

While the foregoing invention has been described in terms of its preferred embodiments, it should be understood that various modifications may be made thereto without departing from the spirit and scope of the invention as defined in the appended claims. It is intended that all such modifications fall within the scope of the appended claims.

What is claimed is:

1. A receiver for a mass interconnect device comprising:
   a frame having a top, a bottom, and two sides forming a face of said frame; and
   one or more engagement cams positioned parallel let to said two sides of said frame;
   wherein, said two sides comprise module mounting means for mounting modules such that a length of a module having an end mounted in said mounting means is perpendicular to said two engagement cams and said length of said module is greater than a width of said module.

2. A receiver for a mass interconnect device according to claim 1 further comprising:
a platform removably mounted to said receiver frame.

3. A receiver for a mass interconnect device according to claim 2 further comprising:
a plurality of supports connected to an underside of said platform.

4. A receiver for a mass interconnect device according to claim 3 further comprising:
a plurality of retractable slides for mounting said supports to test equipment.

5. A receiver for a mass interconnect device according to claim 4 wherein said plurality of retractable slides are respectively connected to said plurality of said supports.

6. A receiver for a mass interconnect device according to claim 2 wherein said platform comprises a table.

7. A receiver for a mass interconnect device according to claim 1 wherein said at least one module mounting member comprises two module mounting members.

8. A receiver for a mass interconnect device according to claim 7 further comprising:
a module connected between said two module mounting members, said module being perpendicular to a plane of movement of said one or more engagement cams.

9. A receiver for a mass interconnect device according to claim 1 further comprising:
an outer sidewall mounted to each of said two sides of said receiver frame.

10. A receiver for a mass interconnect device according to claim 1 wherein said one or more engagement cams comprise linearly moving slide plates.

11. A receiver for a mass interconnect device according to claim 1 wherein said one or more engagement cams comprise rotating latches.

12. A mass interconnect device receiver comprising:
a frame having four sides forming a face of said frame;
an engagement slide positioned substantially adjacent to each two opposing sides of said frame, said engagement slides having a plane a movement;
a module mounting member connected to said receiver frame parallel to said plane of movement of said engagement slides;
a module mounted between said module mounting members and one of said opposing sides such that said module is perpendicular to said plane of movement of said engagement slides.

13. A mass interconnect device receiver comprising:
a frame having first, second, third and fourth sides forming a face of said frame, each of said sides having a length and a width wherein said length of each said side is greater than said width of each said side, said lengths of said first and second sides being parallel to one another, said lengths of said third and fourth sides being parallel to one another, and said first and second sides each having means for mounting an end of a module;
an engagement slide having a plane a movement parallel to said lengths of said first and second sides;
a module mounting member connected to said receiver frame between said third and fourth sides of said frame, said module mounting member having a length and a width, said length of said module mounting member being greater than said width of said module mounting member and being parallel to said plane of movement of said engagement slides;
wherein at least one module may be positioned with a first end of said module mounted to said means for mounting of said first side of said frame and a second end of said module mounted to said module mounting member such that a length of said module is greater than a width of said module and said length of said module is perpendicular to said plane of movement of said engagement cam.

* * * * *

UNITED STATES PATENT AND TRADEMARK OFFICE
CERTIFICATE OF CORRECTION

PATENT NO.         : 7,091,415 B2                                    Page 1 of 1
APPLICATION NO. : 10/919425
DATED              : August 15, 2006
INVENTOR(S)        : Ashby et al.

It is certified that error appears in the above-identified patent and that said Letters Patent is hereby corrected as shown below:

Col. 4,
Line 63, delete "let" after "parallel"

Col. 6,
line 3, change "a plana a movement" to "a plane of movement"
lines 7-8, change "members" to "member"
line 21, change "a plana a movement" to "a plane of movement"

Signed and Sealed this

Fourteenth Day of November, 2006

JON W. DUDAS
*Director of the United States Patent and Trademark Office*